United States Patent [19]

Kaufman et al.

[11] Patent Number: 4,970,457
[45] Date of Patent: Nov. 13, 1990

[54] MRI COMPENSATED FOR SPURIOUS RAPID VARIATIONS IN STATIC MAGNETIC FIELD DURING A SINGLE MRI SEQUENCE

[75] Inventors: Leon Kaufman, San Francisco; Lawrence E. Crooks, Richmond; James D. Hale, Berkeley; David M. Kramer, San Rafael; Kristen Hake, South San Francisco; Heckor Avram, Foster City; Joel Wummer, San Francisco, all of Calif.

[73] Assignee: The Regents of the University of California, Berkeley, Calif.

[21] Appl. No.: 363,187

[22] Filed: Jun. 8, 1989

Related U.S. Application Data

[63] Continuation-in-part of Ser. No. 333,681, Apr. 5, 1989, abandoned.

[51] Int. Cl.[5] ............................................. G01R 33/20
[52] U.S. Cl. .................................... 324/309; 324/307; 324/313
[58] Field of Search ............... 324/300, 306, 307, 309, 324/310, 311, 312, 313, 318, 322

[56] References Cited

U.S. PATENT DOCUMENTS

| | | | |
|---|---|---|---|
| 3,495,162 | 2/1970 | Nelson | 324/310 |
| 3,496,454 | 2/1970 | Nelson | 324/320 |
| 4,300,096 | 11/1981 | Harrison et al. | 324/309 |
| 4,684,889 | 8/1987 | Yamaguchi et al. | 324/308 |
| 4,685,468 | 8/1987 | Macovski | 128/653 |
| 4,885,542 | 12/1989 | Yao et al. | 324/313 |

OTHER PUBLICATIONS

The Society of Magnetic Resonance in Medicine, Second Annual Meeting, Aug. 16–19, 1983, San Francisco, Calif., Program and Book of Abstracts—pp. 332–333.
Society of Magnetic Resonance in Medicine, Third Annual Meeting—Aug. 13–17, 1984, New York, N.Y.—Scientific Program—pp. 100–101.

*Primary Examiner*—Michael J. Tokar
*Attorney, Agent, or Firm*—Nixon & Vanderhye

[57] ABSTRACT

Static $B_o$ field strength is measured during each TR interval of an MRI sequence providing field calibration data used to compensate for rapid variations in $B_o$ during the MRI sequence.

28 Claims, 10 Drawing Sheets

MRI COMPENSATED FOR SPURIOUS RAPID VARIATIONS IN STATIC MAGNETIC FIELD DURING A SINGLE MRI SEQUENCE

This application is a continuation-in-part of our earlier-filed, co-pending, commonly assigned application, Ser. No. 07/333,681, filed Apr. 5 1989, now abandoned.

This invention is generally related to magnetic resonance imaging (MRI) utilizing nuclear magnetic resonance (NMR) phenomena It is more particularly directed to MRI apparatus and method which provides compensation for spurious NMR frequency/phase shifts caused by spurious changes in magnetic fields during NMR data measurement processes.

This application is related to and an improvement with respect to commonly assigned application Ser. No. 07/181,440, filed Apr. 14, 1988 by Yao et al and entitled "MRI COMPENSATED FOR SPURIOUS NMR FREQUENCY/PHASE SHIFTS CAUSED BY SPURIOUS CHANGES IN MAGNETIC FIELDS DURING NMR DATA MEASUREMENT PROCESSES", now U.S. Pat. No. 4,985,542.

MRI is now a widely accepted and commercially available technique for obtaining digitized visual images representing the internal structure of objects (such as the human body) having substantial populations of nuclei which are susceptible to NMR phenomena. In general, the MRI process depends upon the fact that the NMR frequency of a given nucleus is directly proportional to the magnetic field super-imposed at the location of that nucleus. Accordingly, by arranging to have a known spatial distribution of magnetic fields (typically in a predetermined sequence) and by suitably analyzing the resulting frequency and phase of NMR RF responses (e.g., through multi-dimensional Fourier Transformation processes), it is possible to deduce a map or image of relative NMR responses as a function of the location of incremental volume elements (voxels) in space. By an ordered visual display of this data in a suitable raster scan on a CRT, a visual representation of the spatial distribution of NMR nuclei over a cross section of an object under examination may be produced (e.g., for study by a trained physician).

Typically, a nominally static magnetic field is assumed to be homogeneous (with respect to both space and time) within the cross section to be imaged. In addition, typical MRI systems also superimpose magnetic gradient fields of the same orientation but with intensity gradients which are assumed to vary linearly in predetermined directions, (e.g., along mutually orthogonal X,Y and Z axes) while being constant and homogeneous in all other dimensions.

Unfortunately, the "real world" does not always conform exactly to these assumptions. In spite of several techniques known to and used by those in the art to substantially achieve these assumptions, there are inevitably small spurious changes which occur in the magnetic fields during NMR data measurement processes.

Some of the spurious changes in "static" magnetic field strength are relatively slow and operate in a relatively linear manner over the course of a given MRI sequence (typically several minutes in duration). The earlier referenced Yao et al invention provides an extra data taking TR interval at the beginning and at the end of a complete MRI sequence (and possibly including extra such TR cycles interspersed within the normal scan sequence) so as to obtain "templates" of calibration data that may thereafter be used to compensate the MRI data before multi-dimensional Fourier Transformation is effected to create the displayed image.

As taught by Yao et al, during these extra TR intervals, at least one of the phase encoding magnetic gradient pulses is omitted so that Fourier Transformation of the resulting data can provide a frequency measurement directly related to the nominally "static" magnetic field. Changes from the nominally predetermined and fixed $B_o$ "static" magnetic field can thus be detected and used to effect compensation of the gathered MRI data prior to final image reconstruction. Alternatively, such calibration data may be used to modify the physical imager parameters (e.g., to reset the RF center frequency of the transmitter, to reset the magnet current, etc.).

While the provision of such extra "calibration" TR intervals has been found quite useful in compensating for relatively slow essentially linear variation of a nominally "static" $B_o$ magnetic field, we have now discovered certain installations in which more rapidly varying spurious magnetic fields need to be compensated.

For example, sources completely external to the MRI system may cause relatively rapid variation in the nominally "static" field even during a single TR interval (typically of a few seconds duration). For example, large ferromagnetic masses (elevators, trucks, trains, subways, etc.) may be moving nearby and change the ambient spatial distribution of "static" magnetic flux in a relatively short time. These changes may be completely unnoticed when calibration data are taken only at the beginning, end and at a few interspersed times during an MRI sequence. Furthermore, there may be large electrical currents flowing nearby which give rise to stray magnetic fields that change significantly at intervals much shorter than a typical complete MRI sequence. For example, electrically operated street cars, trains, subways, and the like may have rather large surges of DC currents flowing in long linear conductors adjacent and magnetically linked to an MRI facility.

In general terms, such rapidly changing "static" magnetic fields may cause mere noise to appear in the resulting image or may produce serious artifacts. The overall end result may vary from subtle shading changes to totally unrecognizable images.

There are hardware-based techniques already known to correct for at least some of these problems. For example, improved regulation and temperature control of resistive magnet coils, field stabilizing coils and temperature control devices may be used in permanent magnets. Shielding from external magnetic fields may be achieved by using an appropriate ferro-magnetic material to enclose the MRI magnet during an imaging sequence. However, these techniques add cost and complexity and can have maintenance consequences.

Although the Yao et al technique mentioned above is typically implemented in software, it has limited ability to respond in an economic manner to relatively rapid variations in the "static" magnetic field. Induced eddy currents (and their associated magnetic fields) built up during the course of an MRI sequence can also produce artifact as explained in more detail in the related Yao et al application (which is capable of correcting for such relatively slower field variations).

There are also many earlier proposed techniques for better achieving the assumed ideal magnetic field distribution during MRI or other NMR procedures. See, for example, the following non-exhaustive listing of prior art:

U.S. Pat. No. 3,495,162—Nelson
U.S. Pat. No. 3,496,454—Nelson
U.S. Pat. No. 4,300,095—Harrison et al
U.S. Pat. No. 4,684,889—Yamaguchi et al (1987)
U.S. Pat. No. 4,685,468—Macovski (1987)

Shimizu et al, "The Effective Use of Programmable Measuring Technique on NMR Imaging", Program and Book of Abstracts, The Society of Magnetic Resonance in Medicine, Second Annual Meeting, Aug. 16–19, 1983, pp. 332–333.

Bronskill et al "Thermal Stability in Resistive MR Imaging", Scientific Program, The Society of Magnetic Resonance in Medicine, Third Annual Meeting, Aug. 13–17, 1984, pp. 100–101.

Both Nelson references teach prior NMR spectrometer systems which attempt to achieve and improve homogeneity and constant magnetic field strength (e.g., by tracking a variable reference NMR frequency from a special NMR sample via a closed loop control channel). Harrison et al also is directed toward a technique for closed loop control systems aimed at achieving matched shape and magnitude of various magnetic gradient pulses in an MRI system.

Both Yamaguchi et al and Macovski recognize problems caused by variations in the nominally "static" MRI field during imaging procedures. However, both teach alleged solutions which require the use of extra reference signal RF coils (Macovski) or of water phantoms (Yamaguchi et al) in or near the imaged volume They also appear to utilize magnetic gradients switched "on" during receipt of the "reference" signals used to effect compensation for the detected field variations. Yamaguchi et al do note, however, that the correction might be made after the fact to earlier collected MRI data (as an alternative to actually changing machine parameters).

Shimizu et al also allege an ability to compensate for field drift problems in MRI. In FIG. 1 of Shimizu et al, reference signals are derived during application of an X-axis magnetic gradient and the resulting time domain signals are apparently then merely shifted in the time domain so as to align "peaks". However, merely aligning the "peaks" in the time domain is not believed to necessarily compensate properly for field variations (and indeed may cause frequency dispersion artifacts).

Bronskill et al also recognize problems caused by unwanted variation in a "static" MRI magnetic field. However, their "solution" to the problem is to perturb the static magnetic cooling system so as to measure resulting thermally-induced artifacts and thereby to derive data useful for better controlling the temperature of the magnet.

We have now discovered a technique for compensating relatively rapid variations in "static" magnetic fields occurring with periods as short as (or shorter than) a single MRI sequence. Indeed, our discovery permits such compensation to occur on a time scale of a few seconds by recording calibration data at least once during each TR interval of the whole MRI sequence (e.g., which may extend over several minutes).

For example, in a two-dimensional Fourier Transformation multi-slice MRI acquisition sequence, data used to reconstruct the image of a given slice volume is acquired sequentially by applying phase encoding ($G_y$) and readout ($G_x$) magnetic gradients in successive TR intervals. To provide "static" magnetic field calibration data, one such slice out of each set interrogated during a given TR interval can be interrogated without phase encoding or readout gradients. A one dimensional Fourier Transformation (e.g., along the readout direction) then yields a peak at the resonant frequency (which is directly proportional to the "static" magnetic field by the NMR magnetogyric constant).

In this manner, the resonant frequency (and, hence the relative value of the "static" magnetic field) can be measured each time a $G_y$ phase encoded set of MRI data is taken. Thus, for a 256 line image (in the y dimension), there would be 256 resonant frequency measurements. A calibration measurement at the beginning and another at the end of the complete MRI sequence in accordance with the Yao et al teaching would then provide a total of as many as 258 resonant frequency measurements for the complete MRI sequence. The resonant frequency corresponding to each slice volume set of data acquired between these measurement times is derived by interpolating between the two nearest actual resonant frequency measurements.

The resulting calibration data is used to correct the recorded time domain MRI data by applying a first order phase shift in the case of true spin echo imaging sequences. If gradient reversal echo imaging sequences are used (e.g., "echo-planar"), then a zero plus first order phase shift may be effected to the recorded time domain data. These corrections are substantially different than merely "aligning peaks".

As will be appreciated, other types of MRI imaging data could be similarly corrected in the time domain so that previously recorded MRI data is corrected to represent MRI data that would have been obtained at a constant resonant frequency (corresponding to a constant "static" magnetic field). Thereafter, thus compensated MRI time domain data may be subjected to conventional multi-dimensional Fourier Transformation so as to yield compensated images (i.e., having reduced artifact caused by changes in the nominally "static" magnetic field during the MRI sequence).

It should be noted that for multi-slice imaging the just-discussed compensation does not compensate for motion into and/or out of the slice direction. Similarly, in 3DFT, slab-movements into and out of the slab direction are not compensated. Changing the operating frequency (or the slice/slab excitation frequency) during the scan would fix these problems. However, due to the strength of the slice-selection gradients, this position variation is minor compared to the kind of field variations that produce artifacts by movement in the readout direction. Frequency measurement at the end of the scan can be used to correct the nominal field value thus re-aligning the slices/slab for the next scan.

Unless the spurious field changes occur more rapidly than within one TR interval, the exemplary compensation technique just described should produce a faithful representation of the object in spite of the spurious changes in "static" magnetic fields. If corrections for even more rapid changes are desired, it is also contemplated that additional calibration data might be obtained during each TR interval (e.g., as many as one set or template of calibration data for each slice). If a complete spin echo response is recorded for the calibration data, then a larger loss in time efficiency of the overall MRI sequence will be encountered if data is taken more frequently than once per TR interval.

For example, if a 10-slice MRI sequence is involved, a calibration measurement taken once each TR interval may effectively "cost" one of those ten slices (i.e., a 10% loss in time efficiency). Recording calibration data after each slice might effectively "cost" as many as five slices worth of time (e.g., a 50% penalty). The calibration data may be taken directly from the slice volume for which data is to be corrected or it may be taken from another (perhaps dedicated) slice (perhaps at an edge of the image volume). The measurement can also be made from FID and SE data (e.g. a "second" SE or truncated portion thereof may be sufficient to provide the needed calibration data). The RF pulse used to elicit the calibration FID or SE may be other than a 90 degree nutation pulse as should be appreciated.

However, we have also discovered that it is possible to greatly minimize the time penalty for obtaining such calibration data (regardless of how often it is taken in each TR interval throughout the MRI sequence). This reduction in time penalty can be obtained by truncating the recorded calibration spin echo (or other recorded MRI calibration response). As will be appreciated by those familiar with Fourier Transformation phenomena, truncation in the time domain will cause broadening of the "peak" and some ringing artifact in the frequency domain.

However, we have discovered that even very severe truncation (e.g., recording less than 10% and perhaps even less than 5% of the "complete" spin echo response normally recorded for imaging purposes) can be effected without materially impairing the ability to correctly locate the peak center in the frequency domain. Since the only information one needs to extract from the frequency domain for calibration purposes is the resonant frequency, the broadening of the peak and the ringing artifact are of no real concern.

Furthermore, we have discovered that calibration measurements may be made with an initial NMR RF nutation of considerably less than the usual 90°—and that the relevant resonant frequency information may be derived from the FID as well as the spin echo (whether generated by a 180° RF pulse or by gradient reversal).

The calibration measurements can be elicited from each physical slice (e.g., at the end of the imaging echo) or from a common edge slice of the image volume. In either event, spin echo truncation (to durations of less than 10% of the duration of recorded spin echoes used for imaging purposes) can be used for calibration purposes.

By using truncated NMR responses, the effective time intervals between the taking of calibration data can be greatly decreased (thus increasing the ability to compensate for ever more rapid variations in the "static" magnetic field) while still keeping the lost time "cost" for true MRI data gathering purposes to less than a single "slice" time in a relatively long TR procedure.

In three dimensional Fourier Transformation MRI techniques, the "static" field can be measured almost as frequently as desired. For example, if calibration is taken once at the completion of each slice phase encoding step for a 32-slice sequence, a time loss equivalent to that required for obtaining data from only a single slice may be encountered (to represent only about 3% time penalty). Of course, if a complete NMR response is recorded once for every usable MRI data acquisition step, then an approximate doubling in the image time for a complete MRI sequence would again be encountered (for about 50% loss in time efficiency).

We have recently been able to demonstrate the usefulness of these compensation techniques on an MRI magnet with rapidly changing temperature located at a site where a nearby elevator otherwise produced serious artifacts and also under controlled conditions where a large current loop was used to simulate modification of the earth's magnetic field (such as might be caused by rapid movements of nearby ferro-magnetic masses or large current pulses in nearby electrically operated apparatus).

We have identified at least five possible methods for acquiring field calibration spin echo or FID template data during each TR interval. These spin echo templates can be used with any desired MRI image data algorithm (e.g., spin echo—for example, $\phi$-90°-echo, $\phi$-180°-echo, $\alpha$-$\beta$-echo, $\alpha$-$\beta$-$\alpha$-echo, etc.; gradient reversal echo; or FID).

These as well as other objects and advantages of this invention will be more completely understood and appreciated by carefully studying the following detailed description of a presently preferred exemplary embodiment in conjunction with the attached drawings. of which:

Figure 2:
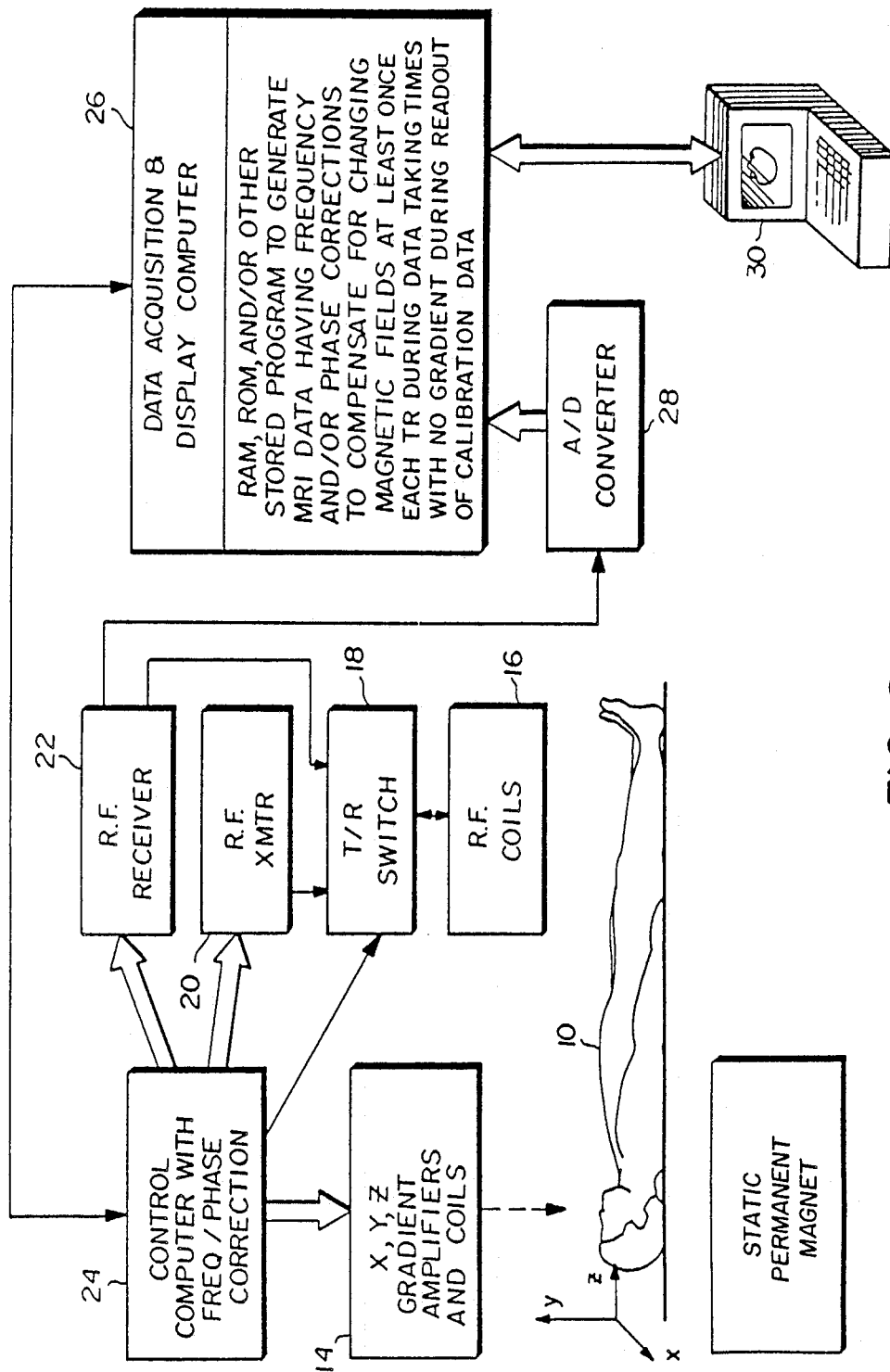
FIG. 2 is a generalized schematic block diagram of an MRI system modified so as to employ the presently preferred exemplary embodiment of this invention.

The novel signal processing and control procedures utilized in the exemplary embodiments typically can be achieved by suitable alteration of stored controlling computer programs in existing MRI apparatus. As one example of such typical apparatus, the block diagram of FIG. 2 depicts the general architecture which may be employed in such a system.

Figure 1A:
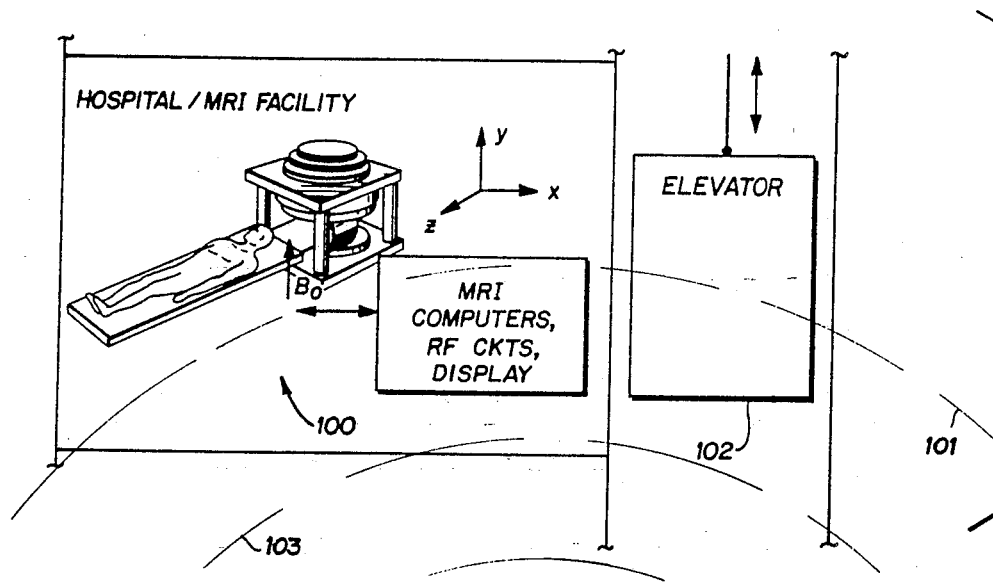
FIG. 1 is a generalized schematic diagram of a typical MRI installation and various possible sources of spurious rapid variation in the "static" magnetic field experienced by the MRI apparatus.
Figure 1B:
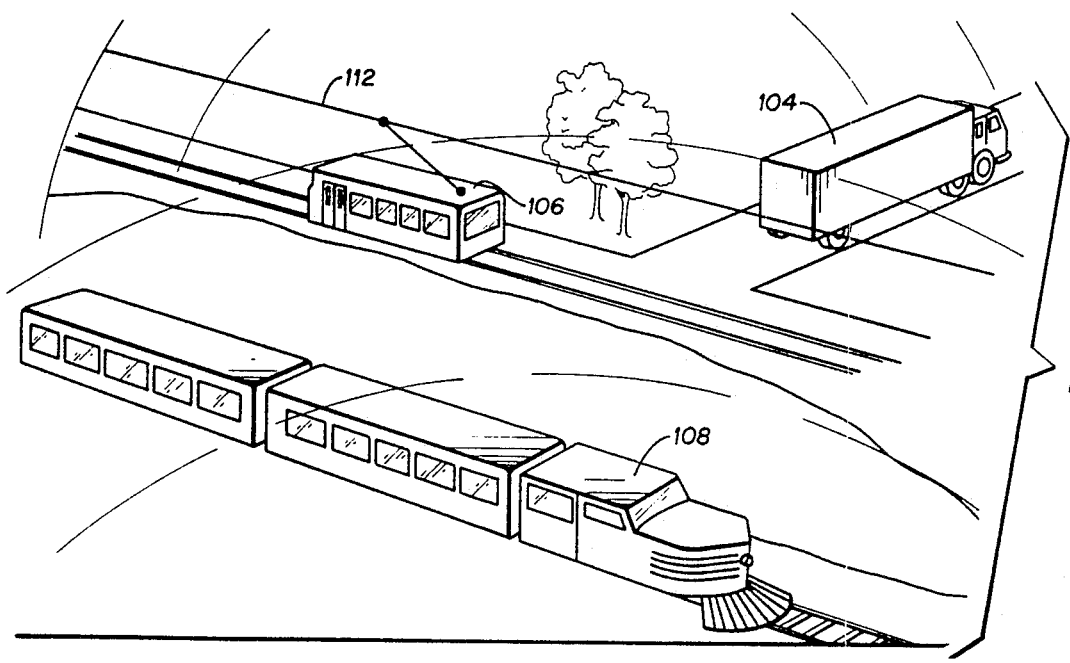
Figure 1C:
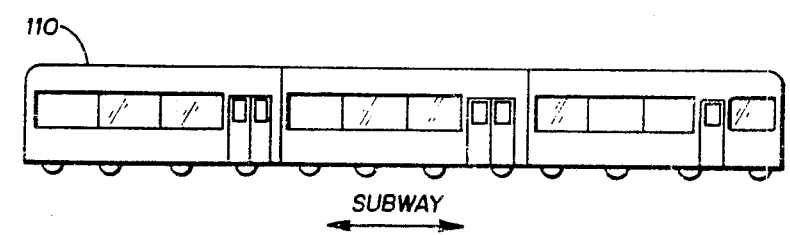

The MRI system 100 is also generally depicted at FIG. 1 in its installed state at a hospital or MRI facility. As depicted in FIG. 1, there may be one or more large moving elevator(s) 102 located near the MRI system 100. In a typical urban environment there also may be nearby moving trucks 104, streetcars 106 trains 108, and/or subways 110. As will be appreciated, almost all of these large moving masses may include large ferromagnetic masses which inherently change the distribution of stray magnetic fields in the vicinity of the MRI system 100 (and cause corresponding changes in the nominally "static" magnetic field $B_o$). Furthermore, at least some of these devices (e.g., streetcar 106, subway 110, etc.) may be associated with large DC current surges along conductors 112 which produce significant stray magnetic fields that are also necessarily varying at a rate that is quite rapid compared to a complete MRI procedure (e.g., typically of several minutes duration).

Typically, a human or animal subject (or other object) 10 is inserted along the one axis of a static (e.g., permanent) magnet which establishes a substantially uniform magnetic field directed along the y-axis within the portion of the object of interest. Gradients are then imposed within this y-axis directed magnetic field along the x,y,z axes by a set of x,y,z gradient amplifiers and coils 14. Suitable NMR RF signals are transmitted into the body 10 and characteristic NMR RF responses are received from the body 10 via RF coils 16 connected by a conventional transmit/receive switch 18 to an RF transmitter 20 and RF receiver 22.

All of the prior mentioned elements may be controlled, for example, by a control computer 24 which conventionally communicates with a data acquisition and display computer 26. The latter computer 26 may also receive NMR RF responses via an analog-to-digital converter 28. A CRT display and keyboard unit 30 is typically also associated with the data acquisition and display computer 26.

As will be apparent to those in the art, such an arrangement may be utilized so as to generate desired sequences of magnetic gradient pulses and NMR RF pulses and to measure NMR RF responses in accordance with stored computer programs. As depicted in FIG. 2, the MRI system of this invention will typically include RAM, ROM and/or other stored program media adapted (in accordance with the following descriptions) so as to generate phase encoded spin echoes during each of multiple TR measurement cycles within each of the possible succession of MRI data gathering scans (sometimes called "studies") and to process the resulting MRI data into a final high resolution NMR image.

Figure 3:
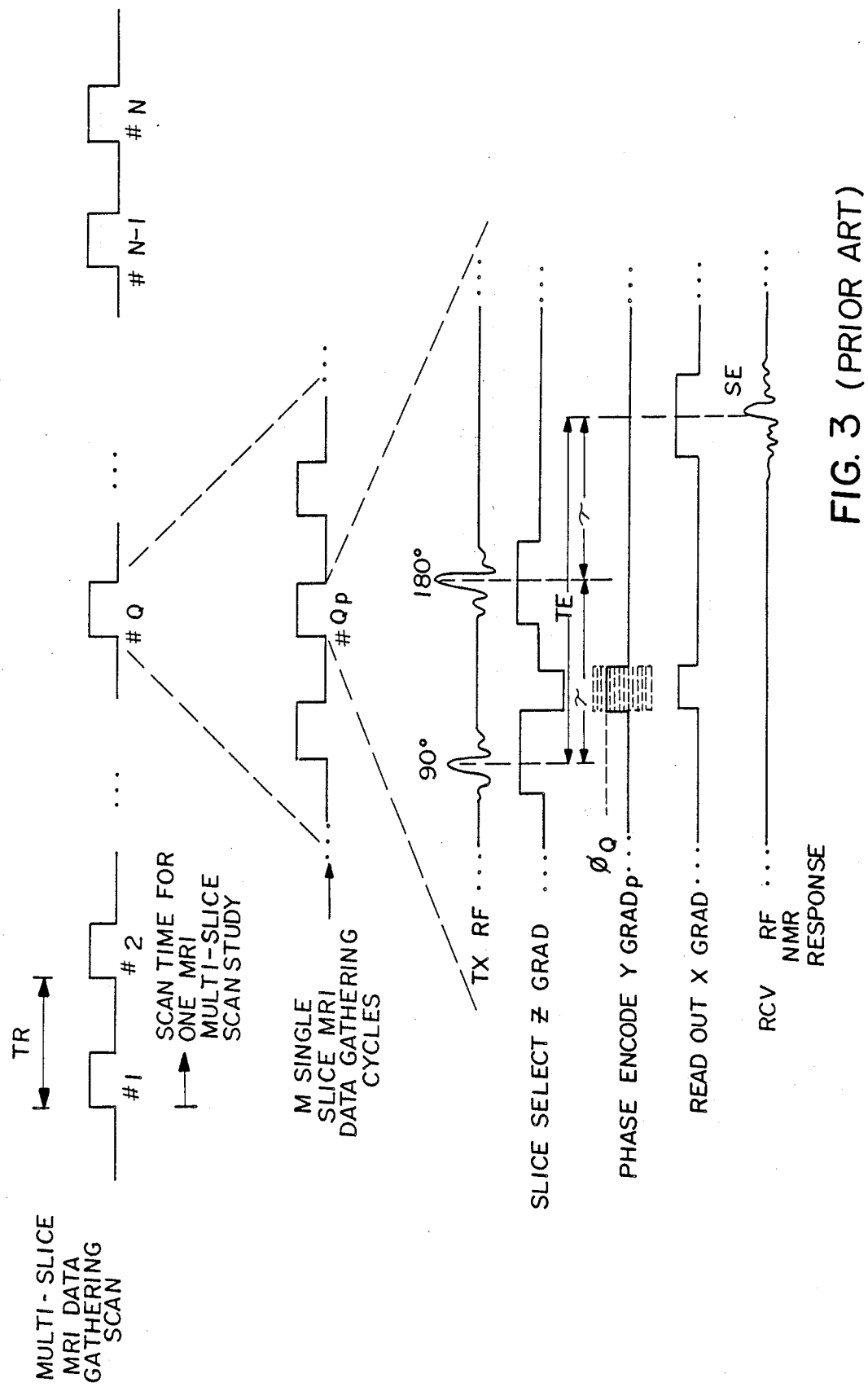
FIG. 3 is a diagrammatic depiction of prior art MRI data gathering sequences.

FIG. 3 depicts a typical prior art data acquisition sequence. Here, a single complete MRI data gathering "sequence" or "scan" or "study" involves a number N (e.g., 128 or 256) of successive data gathering cycles each of duration TR. In fact, if, as depicted in FIG. 3, a multi-slice scan is involved, then each of the N events comprising a single sequence, scan or "study" may actually comprise M single-slice MRI data gathering cycles.

In any event, for a given single slice data gathering cycle, P, a slice selection z-axis gradient pulse (and associated phase correction pulse) may be employed to selectively address a transmitted 90° RF nutation pulse into a slice volume centered about the center frequency of the transmitted RF signal and of sufficient magnitude and duration so as to nutate a substantial population of nuclei within the selected slice-volume by substantially 90°. Thereafter, a y-axis gradient pulse is employed (of magnitude $\phi_Q$ for this particular cycle and varying between maximum magnitudes of both polarities over the N data gathering cycles for that particular slice) to phase encode the signal. After a predetermined elapsed time tau a 180° RF NMR nutation pulse will be transmitted to selectively excite the same slice volume (via application of the appropriate z-axis gradient). In accordance with the "rule of equal times," a true spin echo signal SE evolves, reaching a peak after a further elapsed time tau.

During the recordation of the RF NMR response signal (where amplitude and phase of RF is measured at successive sample points), a readout x-axis magnetic gradient is employed so as to provide spatial phase/frequency encoding in the x-axis dimension Additional spin echo responses can also be elicited by the use of additional 180° nutation pulses or suitable other techniques—albeit they will be of decayed amplitude due to the NMR T2 decay.

The time-to-echo TE is depicted in FIG. 3 as is the repetition time TR. As just explained, TE interacts with the T2 NMR exponential decay parameter to reduce signal amplitude. The TR interval interacts with the T1 NMR exponential recovery parameter so that one generally has to wait for substantial relaxation of previously excited nuclei before the next measurement cycle of the same volume starts. (Note, however, that the inactive time during each TR interval is not shown to scale in FIG. 3 and may be quite small.)

It will be noted that during each RF excitation pulse, there is a slice selection $G_z$ magnetic gradient pulse switched "on" so as to selectively excite only the desired "slice" or "planar volume" (e.g., a slice of given relatively small thickness such as 5 or 10 millimeters through the object being imaged). During each resulting spin echo NMR RF response, x-axis phase encoding is achieved by applying an x-axis magnetic gradient during the readout procedure (typically each spin echo pulse is sampled every 30 microseconds or so with digitized sample point, complex values, data being stored for later signal processing).

As depicted in FIG. 3, it will be understood that, in practice, the number of measurement cycles typically is equal to the number of desired lines of resolution along the y-axis in the final image (assuming that there is no data synthesis via conjugation processing). After a measurement cycle is terminated with respect to a given "slice," it is alloWed to relax for a TR interval (usually on the order of the relaxation time T1) while other "slices" are similarly addressed so as to obtain their spin echo responses. Typically, on the order of hundreds of such measurement cycles are utilized so as to obtain enough data to provide hundreds of lines of resolution along the y-axis dimension. A sequence of N such y-axis phase encoded spin echo signals is then typically subjected to a two-dimensional Fourier Transformation process so as to result in an N×N array of pixel values for a resulting NMR image in a manner that is by now well understood in the art.

Such prior art MRI techniques are based on the assumptions:

(a) that the static magnetic field does not drift over the several minutes required for an entire MRI data gathering scan or "study" (or perhaps even a sequence of plural such scans) and (b) that the magnetic fields induced by remnant eddy currents do not introduce any phase error in the recorded spin echo signals (an assumption which is especially important where synthesized complex conjugate data are utilized).

In a superconducting magnet, static field drift compensation is probably not as important as in the typically lower field, permanent magnet MRI systems.

In at least some typical MRI systems now commercially available (e.g., those available from Diasonics Inc.), if an NMR spin echo response is generated and recorded in the absence of any magnetic gradient pulse, then ideally the response will comprise only a very narrow band of frequencies (corresponding to the frequencies in the selected slice) and all of the sampled time domain responses will have the same zero relative phase. Accordingly, (as taught in the related Yao et al application noted above) by actually taking such data in one or more extra "calibration" measurement cycle(s), and by noting the extent to which the detected frequency spectrum differs from the expected, and the extent to which the relative measured phase of the sampled RF signals differs from zero, one can derive compensation factors (a) to be applied to the already recorded data and/or (b) to reset the RF transmitter center frequency for subsequent NMR measurement cycles. Compensation to already collected spin echo data taken within a given measurement cycle can be made by appropriately phase/frequency shifting the data (either in the time domain or the frequency domain)

When a slowly drifting field strength is the main concern, the frequency spectrum of the spin echo during extra "calibration" cycles can be obtained (in accordance with the prior related Yao et al teaching) where no phase encoding or readout gradient is employed (e.g., as in FIG. 4), as a measurement of the actual quiescent field strength. For example, the NMR spin echo elicited from a slice volume at the nominal center of the magnet effectively measures the field at this location. Spin echoes elicited during the "calibration" cycle from other slices located at distances from the center of the magnet will also vary in frequency due to inhomogeneities in the static magnetic field and due to fields caused by remnant eddy currents and the like.

If, for whatever reason, the actual magnetic field distribution changes from the assumed ideal during the course of a scan sequence, then the frequency domain peak of the spin echo in the first extra "calibration" measurement cycle (e.g., see FIG. 4) will be different from that of the last extra calibration measurement cycle. If the frequency drift is assumed to be linear over the entire scan interval, then a corresponding incremental linear correction (proportional to the elapsed time from the beginning of the scan sequence and to the overall incremental change during the entire scan sequence) may be applied to all of the recorded data during its processing. Furthermore, if successive or multiple scans or "studies" are employed, a slow frequency drift (caused by a corresponding field drift) will cause a given imaged object to effectively slide across the image space with respect to time such that given slice volumes effectively move with respect to a fixed spatial coordinate system as the NMR frequency changes in response to spurious magnetic field changes. This can be corrected in accordance with Yao et al by periodically resetting the center frequency of the RF transmitter during a plurality of MRI sequences.

Figure 4:
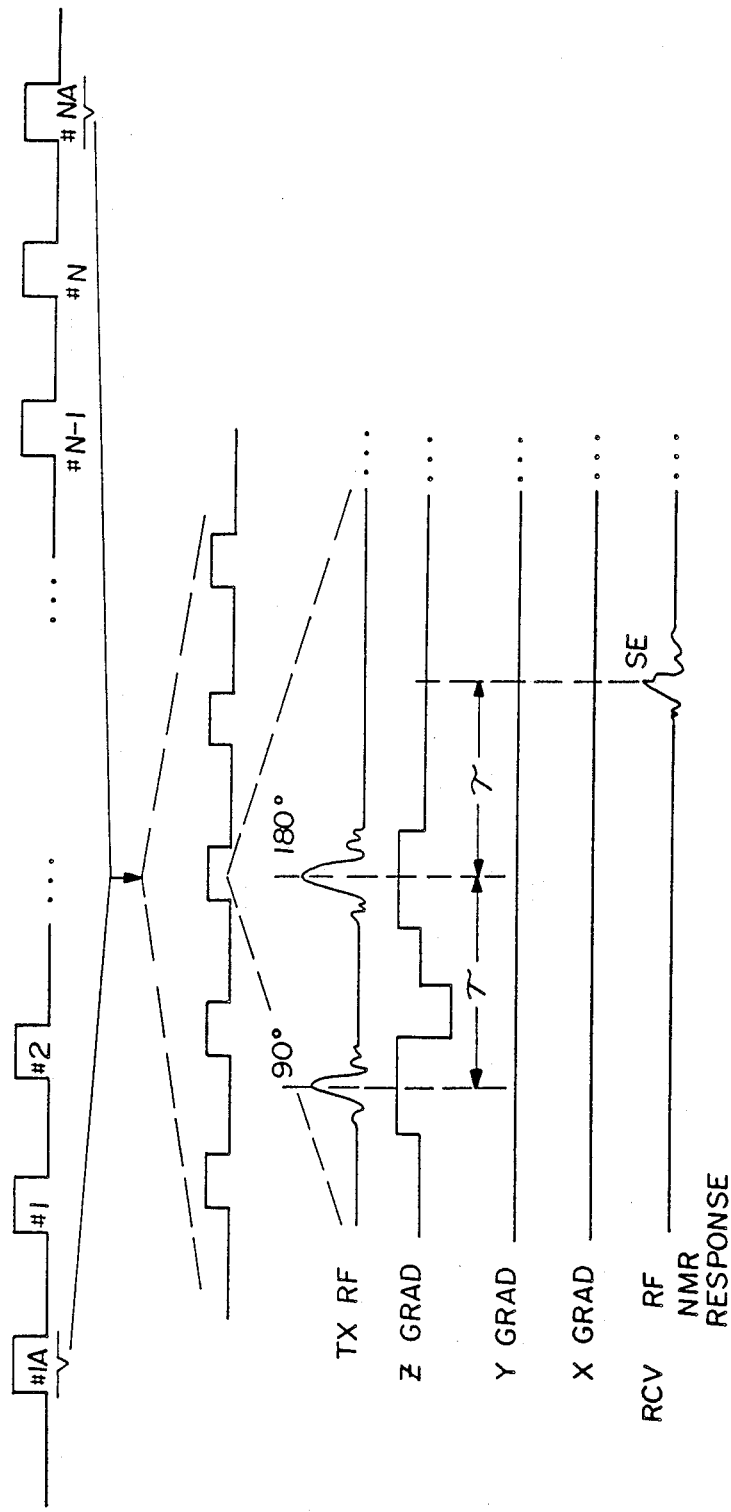
FIG. 4 is a similar to FIG. 2, but additionally depicts exemplary extra measurement cycles taken at the beginning and end of an MRI sequence (without the use of X and Y magnetic gradient pulses) in accordance with the related Yao et al prior art application referenced above.

In practice, the prior art Yao et al process can be done in a number of ways. The special "calibration" cycles such as depicted in FIG. 4 (i.e., those omitting all of the magnetic gradient pulses—e.g., except for the slice selective gradient pulses) may be interspersed within the normal scan sequence or may be tacked onto the beginning and/or end of such a sequence as should be apparent to those in the art in view of the above description. For example, if one desires 128 projections, then 130 measurement cycles may actually be employed so as to collect additional first and last measurement cycles (without x and y gradient pulses). These extra "calibration" measurement cycle data are stored as "templates" on disc along with the other conventional 128 measurement cycle data and used by the MRI control computer to change the transmit frequencies used for subsequent scans.

Such recorded "calibration" data may also be used by the MRI array processor during image reconstruction so as to provide corrections to concurrently recorded MRI data. For example, the array processor may use them as soon as possible to produce a conventional 128 line image—thus, avoiding any requirement for the long term storage of extra image data. In another approach, the first and last "calibration" measurement cycles can be cycle numbers 1 and 128 so that only 126 phase encoded projections are actually acquired and used in the image reconstruction process. In this alternative, the array processor may fill the usual first and last data sets with zeros so that it will still conventionally process 128 projections—albeit there is meaningful information in only 126 of those projections. This will slightly reduce image resolution—but may be preferable for retrofitting existing MRI systems where disc files and the like are already formatted so as to accept a certain size data file (e.g., corresponding to 128 projections).

Figure 5:
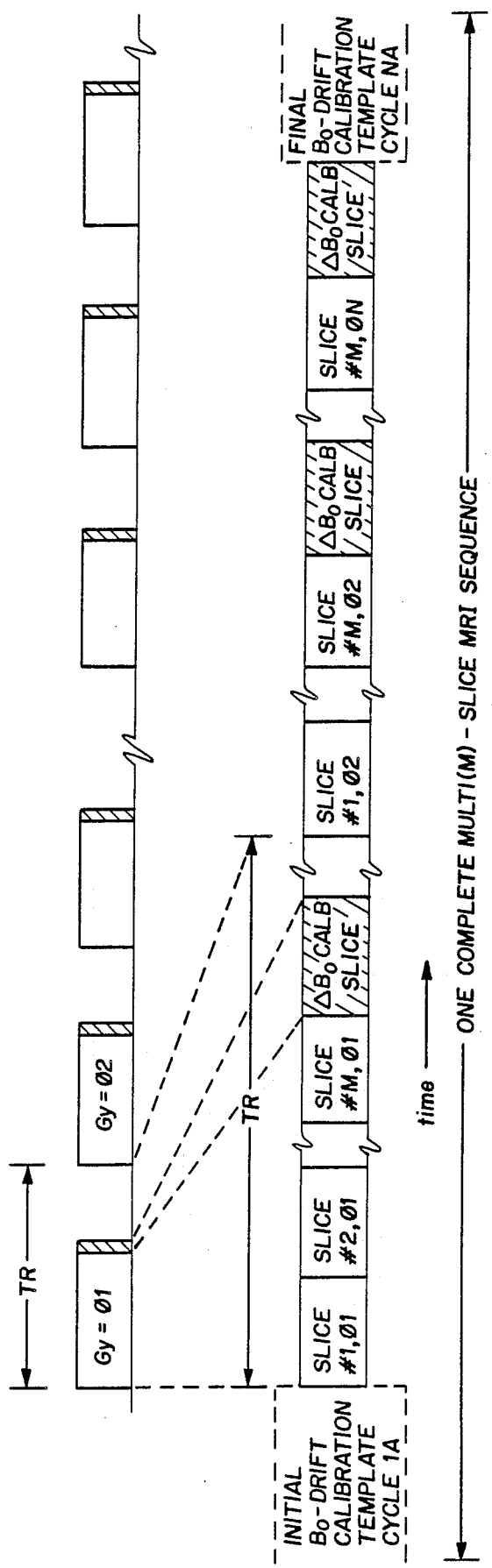
FIG. 5 is a schematic time diagram showing a presently preferred exemplary embodiment of this invention in which, during each TR interval of a multi-slice MRI sequence, the time normally devoted to MRI image data recordation for one slice is instead devoted to the recordation of magnetic field calibration data.

A simplified timing diagram is depicted in FIG. 5 where a few TR intervals of a given MRI sequence are depicted (once again the inactive portion of each TR cycle is not shown to scale). The portion of each interval devoted to the generation and recording of field calibration data is depicted in cross hatching so as to provide some visual indicator. In the lower portion of FIG. 5, an expanded scale is used to provide a similar depiction, but in more detail. Here, the initial and final magnetic field of calibration cycles 1A and NA of Yao et al are depicted in dotted lines.

As will be seen in FIG. 5, for each multi-slice phase encoding TR interval, one of the "slice times" is sacrificed for the generation and recordation of field calibration data for a given calibration slice. As should be appreciated, in this exemplary embodiment, although a slice selective $G_z$ gradient pulse would be utilized during transmission of the NMR 90° and 180° RF pulses, no y-axis phase encoding gradient $G_y$ would be used and no x-axis phase encoding readout gradient $G_x$ would be used. Otherwise, the data gathering sequence would be the same as for any other actually imaged slice using a true spin echo sequence as described above.

As will also be explained below, the time required to achieve sufficient calibration data might be significantly reduced in this embodiment by suitable use of less than 90° NMR RF excitation pulses and/or by greatly truncating the recorded portion of the NMR response.

Figure 6:
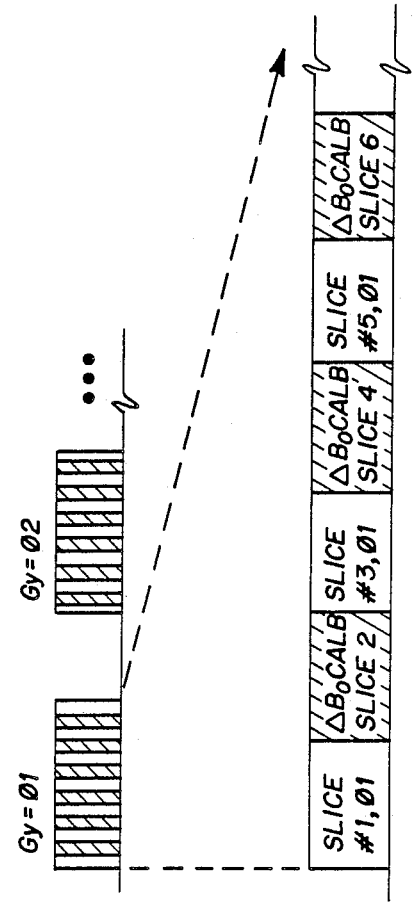
FIG. 6 is a time diagram similar to FIG. 5, but illustrating another exemplary embodiment of this invention wherein every other slice volume time of a multi-slice MRI sequence is utilized for gathering and recording field calibration data.

FIG. 6 is a simplified timing diagram similar to that of FIG. 5 but illustrating another exemplary embodiment wherein every other slice-time of a multi-slice sequence is devoted to the gathering and recordation of field calibration data. As will be appreciated, this embodiment suffers a 50% decrease in time efficiency. As with the embodiment of FIG. 5, significant time savings may be had by using shortened RF NMR excitation pulses and/or truncated NMR RF responses.

Figure 7:
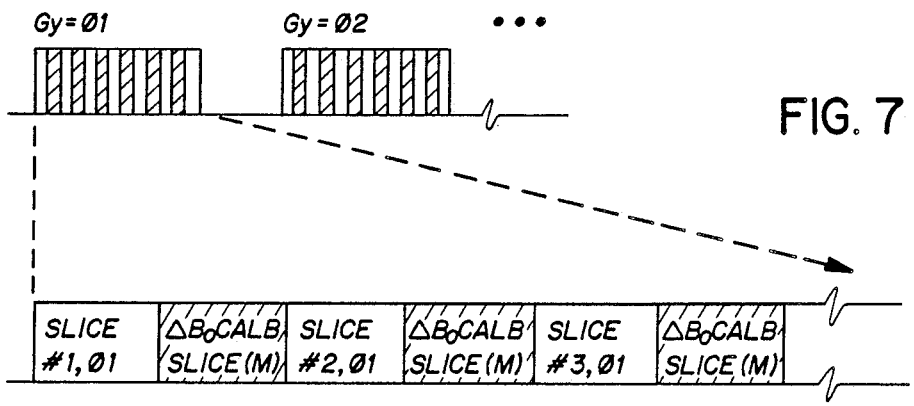
FIG. 7 is similar to FIG. 6 but illustrates an exemplary embodiment in which the field calibration data is obtained from a single dedicated physical slice volume.

FIG. 7 is a simplified timing diagram very similar to that of FIG. 6. However, it will be noted from FIG. 7 that field calibration data is taken from a common "end" slice M rather than from interleaved slices as in FIG. 6.

Figure 8:
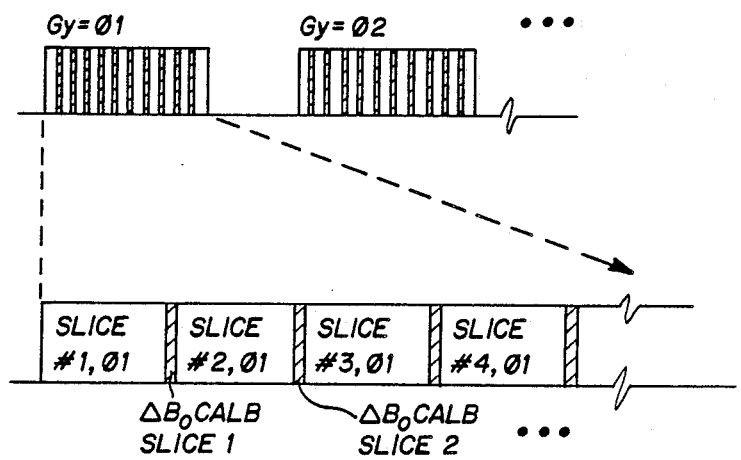
FIG. 8 is a timing diagram also similar to FIG. 6 but illustrating the use of greatly truncated NMR responses for field calibration data associated with each slice of the multi-slice MRI sequence.

FIG. 8 is a timing diagram illustrating yet another exemplary embodiment wherein field calibration data is taken from each slice—but a significantly shorter time sacrifice is made due to the use of greatly truncated NMR responses and/or RF NMR excitation pulses.

Figure 9:
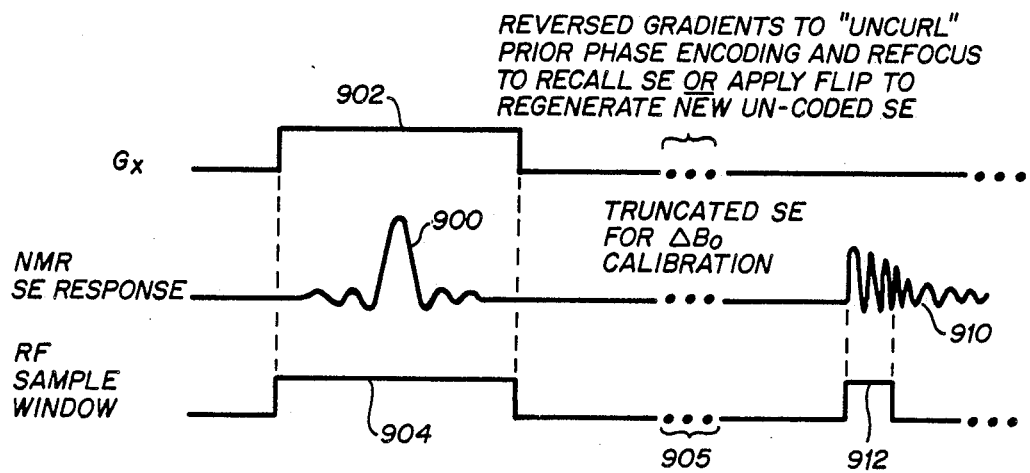
FIG. 9 is a schematic timing diagram of the NMR responses, RF sample windows and $G_X$ magnetic gradient pulses employed with the embodiment of FIG. 8 and illustrating, in general, the manner in which truncation of NMR responses can increase the time efficiency of any embodiment of this invention.

The nature of the truncated RF NMR response used for generating sufficient field calibration is depicted in more detail at FIG. 9. Here, the traditional spin echo response 900 is generated (by conventional processes not depicted in FIG. 9) during a $G_x$ readout gradient pulse 902 and an RF sampling window 904. Thereafter, RF and/or magnetic gradient pulses are used in a traditional manner so as to refocus or recall a spin echo response 910. However, as will be noted in FIG. 9, no $G_x$ readout gradient is applied during the truncated RF sample window 912 which may exist for only a very small portion (e.g., 10% or less) of the usual RF sample window duration. Because there is no applied gradient during readout, a small portion of the maximum SE response 910 thus occurs first and is sampled. Although this implies a severe broadening of the peak width and perhaps ringing artifact in the frequency domain after Fourier Transformation, it is still sufficient to accurately locate the center of the broadened peak in the frequency domain and thus determine the location of the resonant frequency (and hence the "static" magnetic field strength) at that particular time in the ongoing MRI sequence.

To obtain magnet calibration data in accordance with the exemplary embodiments one must substantially avoid both readout and "classic" phase-encoding gradients (including, for example, the lingering effects of prior phase-encoding gradient pulses). Thus, for 2DFT one needs to remove the readout ($G_x$) and phase-encoding ($G_y$) gradients to obtain proper calibration data. For 3DFT, one needs to remove the readout gradient and both "classic" phase encoding gradients.

There are at least two ways to remove the effects of "classic" phase-encoding gradient pulse(s) which precede the readout. In this regard, it is to be noted that when one excites the measured spins directly, only the slice/slab selective gradient is applied.

In the FIG. 9 embodiment where an image data spin echo precedes a second calibration data echo, one must cancel the effect of both the readout phase requires reversing the readout gradient for a time to "uncurl" the area accumulated from the readout pulse. The phase-encoding gradient(s) is (are) also reversed to "uncurl" their prior effect. This "uncurling" via reversed gradients occurs at 905 in FIG. 9 (i.e., between events 904 and 912).

Current attempts to thus recall the SE have resulted in quite low SE signal levels. Therefore, in this embodiment we now prefer to apply at 905 a low magnitude flip angle to the slice after 904 so as to regenerate and acquire a fresh spin echo signal (without phase encoding).

Thus, there are basically two operating modes:

(1) find a time and a location to excite a slice and get an NMR response signal with no phase encoding; or (2) generate another version (echo) of an image data NMR response while effectively cancelling the existing phase encoding(s) between the image data acquisition and the calibration (frequency) data acquisition (e.g., by use of reverse phase encoding gradient pulses). This second mode is useful, for example, in the embodiments of FIGS. 13C, 13D, 13E, 13F and 13G discussed in more detail later.

As will be appreciated, the gradients used for phase encoding may be in any direction including mixtures of the three primary directions x, y and z. Oblique imaging may use mixtures of two gradients for slice selection and readout. Any one gradient may be common to both mixes. In 3DFT imaging, one of the phase encodes is also used for the slab selection.

As the "static" magnetic field varies, a corresponding phase variation is introduced to the MRI data causing images to shift. If the recorded time domain MRI data, phase encoded in two dimensions, is plotted along successive lines (each line being vertically displaced in accordance with the y-axis phase encoding), the resulting plot is said to be in "k-space". K-space templates derived from extra TR-interval cycles in accordance with Yao et al permit the image to be re-centered using appropriate phase shifts in k-space prior to two dimensional Fourier Transformation and image reconstruction.

Significant field drift during an acquisition (e.g., corresponding to a shift in position of 3 pixels) can cause image artifacts such as edge ghosting. As already explained, using the prior art Yao et al technique, field correction templates can be derived before and after each MRI sequence (or by adding TR intervals interspersed within an MRI sequence) so that adjustments can be made to the data acquired throughout the sequence. A shift of one pixel adds a phase ramp having a location in the y dimension slope of $\pm 2\pi/nx$, where nx equals the number of pixels in the x dimension (e.g., 256). Therefore a shift of m pixels has a slope of $\pm 2m\pi/nx$ where m can be fractional. By subtracting this phase ramp from the data, such slow changing artifacts can be eliminated.

Figure 10:
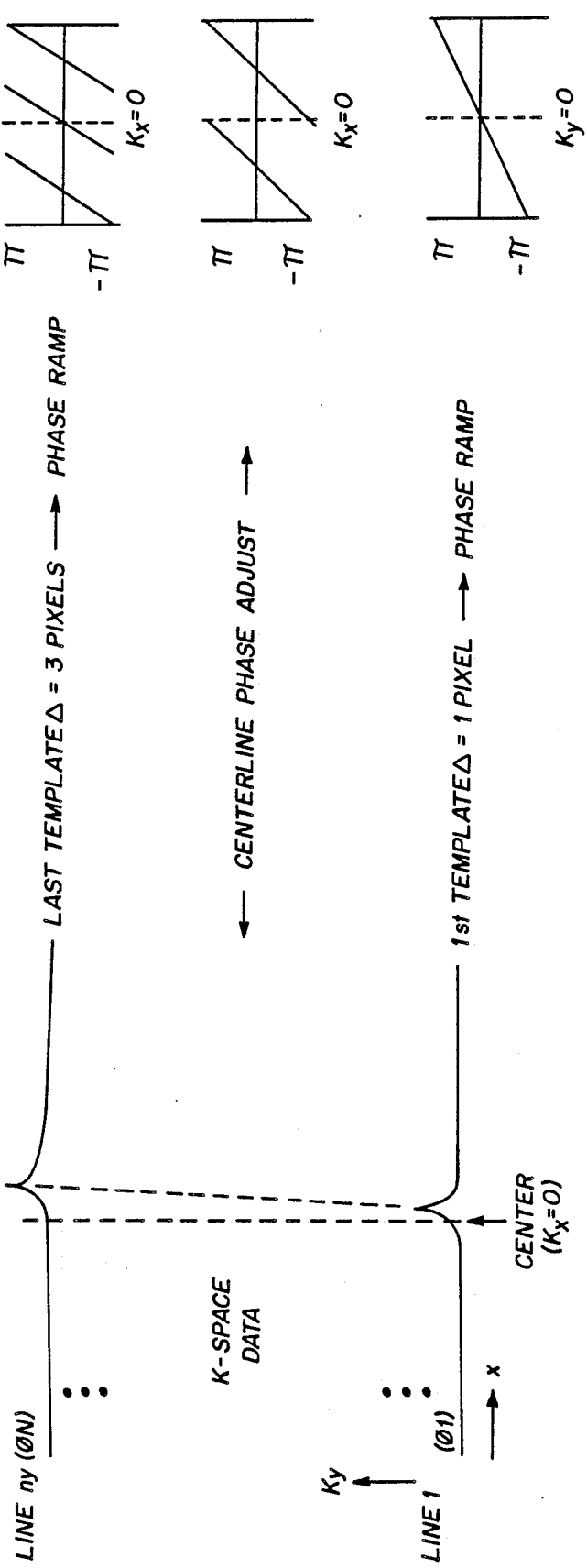
FIG. 10 is a schematic diagram in k-space illustrating the frequency shift that might typically be used in the prior art Yao et al invention to compensate k-space data prior to Fourier Transformation to produce the final image.

For example, as depicted in FIG. 10, if the first template shows a one pixel shift and the last template shows a three pixel shift, then it can be inferred that the field has drifted sufficiently to cause a shift of one pixel since the last center frequency adjustment of the MRI apparatus at the beginning of this particular MRI sequence. In the FIG. 10 example, the field has drifted sufficiently to cause an additional 1 two pixels of shift during the MRI sequence. By gradually increasing the slope of the phase ramp from $2\pi/nx$ to $6\pi/nx$ as the data is phase corrected from the first to the nth line of data in the k-space prior to multi-dimensional Fourier Transformation, the slow overall drift in "static" field strength can be compensated in accordance with the prior art Yao et al technique.

In accordance with the present invention, a similar k-space template is generated for every TR interval.

Therefore, one can better trace rapid, non-linear changes in the "static" field. For example, simulated elevator interference reveals many artifacts which may be eliminated by using k-space correction based upon templates taken every TR cycle.

As will be appreciated, for true spin echo MRI sequences (i.e., where the spin echo is generated by a 180° RF nutation pulse), the applied phase ramps must pass through 0° at the zero frequency "bin" (i.e., bin number $nx/2+1$ located at the center of the x-axis in k-space). For gradient echoes (i.e., "spin echoes" recalled by reversed polarity magnetic gradient pulses), the phase ramps must pass through 0° at the center of the initially applied perturbing RF NMR excitation pulse (i.e., which occurred before the first "spin echo" response).

Figure 11:
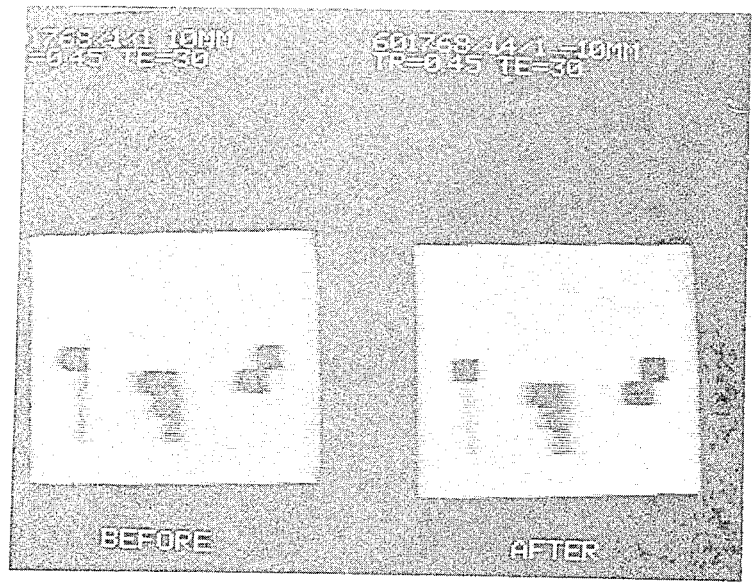
FIGS. 11 and 12 are photographs illustrating "before" and "after" images obtained using this invention with both true spin echo and gradient echo MRI sequences.
Figure 12:

The photograph of FIG. 11 shows an image of a phantom using a true spin echo MRI sequence both before correction and after correction in accordance with this invention. The photographs of FIG. 12 show similar "before" and "after" images using a gradient echo type of MRI sequence. As might be expected, since the gradient echo sequence is more vulnerable to magnetic field-induced errors, there is a greater degree of improvement noticed in FIG. 12.

FIGS. 13A–13G provide a visual "tree" of the relative physical volume position and intra-TR-interval timing for at least five possible data acquisition sequences which include acquisition of a field calibration template during each TR interval.

In each FIGURE, an open box represents a process for acquiring MRI image data at a particular relative time and at a particular relative slice or slab position in space. A cross-hatched box represents a process for acquiring magnet calibration data (i.e., without phase-encoding gradients) at a particular time and slice/slab location.

To further help appreciate the large number of possibilities:
1. let A represent the image data;
2. let B represent the field correction template data.

The A data (full or truncated) can be acquired from various NMR responses such as spin-echo (SE) gradient reversal echo (GRE) or free induction decay (FID). Here, it should be understood that a spin-echo includes those spin echo responses which may be produced by many different nutation sequences:
 a. $\phi$- 90°- echo
 b. $\phi$- 180°- echo
 c. $\alpha$-$\beta$- echo
 d. $\alpha$-$\beta$-$\alpha$- (stimulated) echo The B data (full, truncated or truncated to less than 10%) can be acquired from spin-echo (SE) or free induction decay (FID) responses.

Figure 13A:
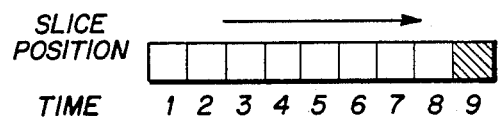
FIGS. 13A, 13B, 13C, 13D, 13E, 13F and 13G are diagrams illustrating at least seven different position/- timing sequence options for acquiring the field calibration templates.
Figure 13B:
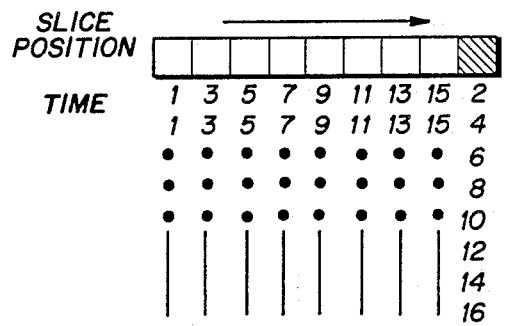
Figure 13C:
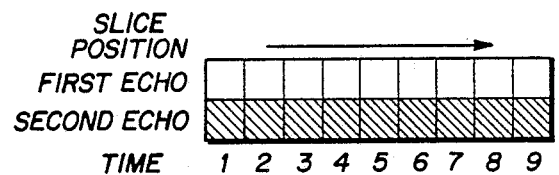
Figure 13D:
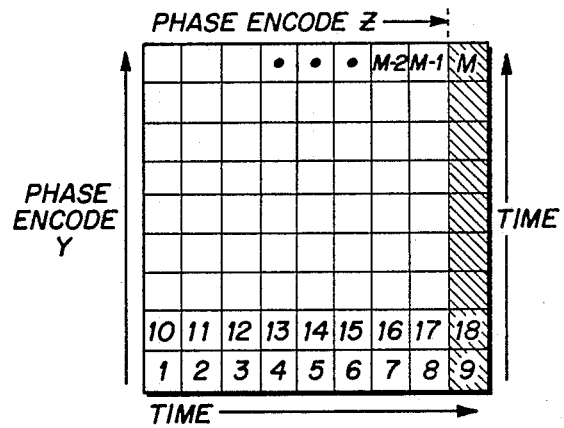
Figure 13E:
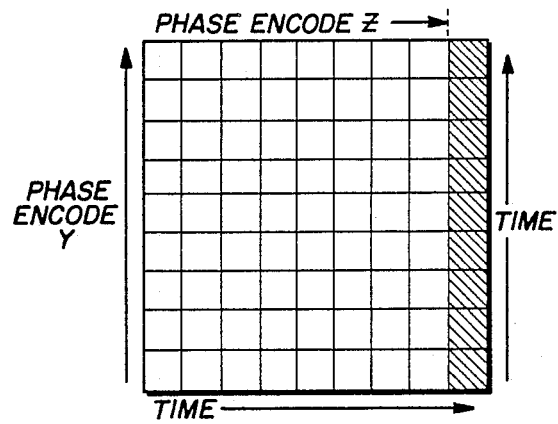

The phase encode axes of FIGS. 13D and 13E should not be confused with the time axes of the same FIGURES. Both phase encode progressions proceed together and time does elapse during such processes. The time scale is over the multiple TRs used to measure the combinations of Y and Z phase encodings. As shown (e.g., see FIG. 13D), one may start at the lower left corner and zig-zag across and upward with phase encoding cycles (other paths are also possible so long as one periodically measures the frequency). The final encoding is depicted at $M-1$ in the upper right (note that the cross-hatched boxes 9, 18 ... M are calibration measurements with no phase encoding).

Figure 13F:
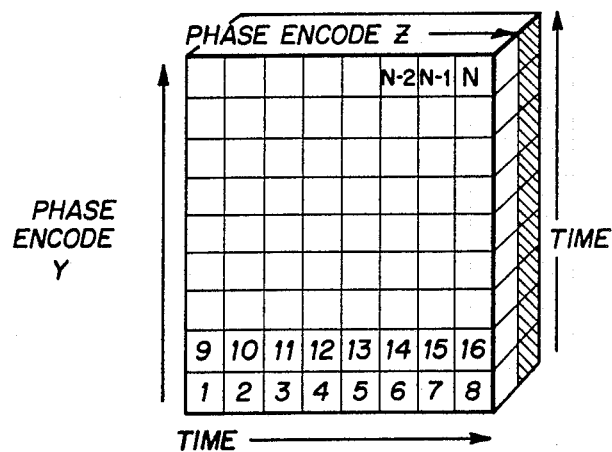
Figure 13G:
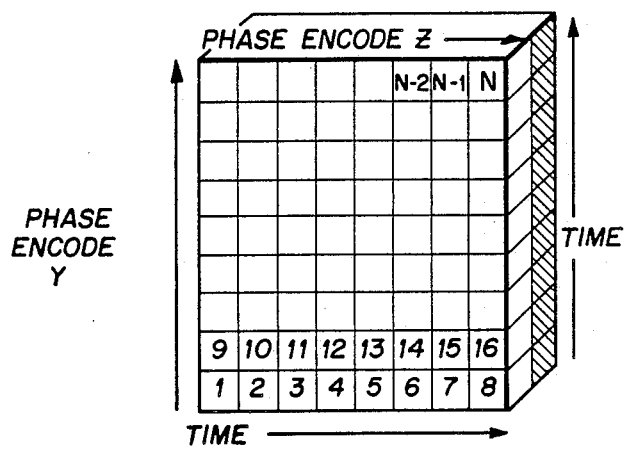

In the FIG. 9 embodiment, a frequency measurement is made after each phase encoded image data measurement. This may be a second echo or excitation of a volume. FIGS. 13F and 13G depict one example of the second echo as the template measurement. This extra measurement after every phase-encode image data measurement eliminates the extra column of template measurements shown in FIGS. 13D and 13E.

As can be seen, there are a very large number of possible combinations/permutations of these possibilities. We have now actually implemented about a dozen of these possibilities.

In general, we presently prefer to use spin-echo correction templates with any type of image data (e.g., especially for gradient reversal echo images).

We have also discovered that, in addition to Fourier Transformation, there are at least two other possible methods which may be used to obtain template correction data from the measured NMR responses:
 (a) measure the slope of the phase of the NMR signal
 (b) extract the fundamental frequency only (e.g., by fitting a sine curve to the echo.

Although this invention has been described in connection with an exemplary embodiment using a Fourier Transformation reconstruction technique, it will be understood that other essentially equivalent integral transform reconstruction techniques could be used. For example, the Hartley Transform is one such technique. In addition, back-projection techniques might be used for data acquisition and corrected prior to implementation of any one of the many known reconstruction techniques for this type of data. Other patterns of scanning k-space may also be employed (e.g. spiral or otherwise different from rectangular raster scanning). Any form of serial sampling of k-space with interspaced field measurements and correction of k-space data prior to final image reconstruction from the corrected k-space data may be used.

While only a few exemplary embodiments of this invention have been described in detail, those skilled in the art will appreciate that many variations and modifications may be made in these exemplary embodiments while yet retaining many of the novel features and advantages of this invention. Accordingly, all such variations and modifications are intended to be included within the scope of the appended claims.

What is claimed is:
1. A magnetic resonance imaging (MRI) method providing compensation for variations of a nominally static $B_o$ field in an imaged volume during an MRI sequence, said method comprising the steps of:
 (a) generating and recording MRI image data which is phase-encoded by magnetic gradient pulses during a sequence of plural successive TR intervals to yield an image of nuclear magnetic resonant (NMR) nuclei populations within said image volume after multi-dimensional transformation;
 (b) during each said Tr interval, additionally generating and recording $B_o$ field calibration data by omitting at least one of said magnetic gradient pulses during recordation of NMR responses;
 (c) processing said calibration data to generate correction data required to compensate MRI image data taken during each TR interval for $B_o$ magnetic field variations in the nominally static $B_o$ field;
 (d) phase/frequency shifting said MRI image data for each TR interval in accordance with said correction data; and
 (e) multi-dimensionally transforming the corrected MRI image data resulting from step (d) to produce an image having reduced artifacts caused by variations in the nominally static $B_o$ field during said MRI sequence.

2. A magnetic resonance imaging method as in claim 1 wherein:
   (i) as a part of step (a), during each TR interval NMR responses are selectively elicited from M plural successive slice volumes for a given $\phi$ phase encoding value of a first-dimension magnetic gradient pulse, a second-dimension phase encoding magnetic gradient pulse being present during said NMR responses; and
   (ii) as a part of step (b), during each TR interval, a further NMR response is selectively elicited from at least one further M+1 slice volume but without said magnetic gradient pulses being present during said further NMR response.

3. A magnetic resonance imaging method as in claim 1 wherein:
   (i) as part of step (a), during each TR interval NMR responses are selectively elicited from plural first slice volumes for a given $\phi$ phase encoding value of a first-dimension magnetic gradient pulse, a second-dimension phase encoding magnetic gradient pulse being present during said NMR responses; and
   (ii) as a part of step (b), during each TR interval further NMR responses are selectively elicited from further plural second slice volumes but without said second-dimension magnetic gradient pulse being present during said further NMR responses; said second slice volumes being interleaved with said first slice volumes.

4. A magnetic resonance imaging method as in claim 1 wherein:
   (i) as part of step (a), during each TR interval NMR responses are selectively elicited from M plural successive slice volumes for a given $\phi$ phase encoding value of a first-dimension magnetic gradient pulse, a second-dimension phase encoding magnetic gradient pulse being present during said NMR responses;
   (ii) as a part of step (b), during each TR interval, further NMR responses are selectively elicited from at least one further M+1 slice volume but without said magnetic gradient pulses being present during said further NMR responses; and
   (iii) said step (ii) being repeatedly performed within each TR interval and interleaved with elicitation of NMR responses from said M plural successive slice volumes in step (i).

5. A magnetic resonance imaging method as in claim 1 wherein:
   (i) as a part of step (a), during each TR interval NMR responses are selectively elicited from M plural successive slice volumes for a given $\phi$ phase encoding value of a first-dimension magnetic gradient pulse, a second-dimension phase encoding magnetic gradient pulse being present during said NMR responses; and
   (ii) as a part of step (b), during each TR interval immediately after eliciting each NMR response in step (i), removing residual phase encoding effects and eliciting a further NMR response from the same slice volume but without said magnetic gradient pulses being present during said further NMR response.

6. A magnetic resonance imaging method as in claim 2, 3, 4 or 5 wherein only a substantially truncated portion of said further NMR response is recorded as compared with the recorded NMR responses for step (a).

7. A magnetic resonance imaging method as in claim 6 wherein the duration of NMR responses recorded as part of step (b) are truncated to less than 10% of the duration NMR responses recorded as a art of step (a).

8. A magnetic resonance imaging method a in claim 1 wherein NMR responses are recorded in step (b) truncated to a substantially decreased duration compared to NMR responses recorded in step (a).

9. A magnetic resonance imaging method as in claim 8 wherein the duration of NMR responses recorded as part of step (b) are truncated to less than 10% of the duration of NMR responses recorded as a part of step (a).

10. A magnetic resonance imaging method as in claim 1 wherein step (a) includes eliciting NMR responses simultaneously from an entire imaged volume using a sequence having three dimensions of spatial-domain phase encoding obtained by varying magnetic gradient pulses.

11. Magnetic resonance imaging (MRI) apparatus providing compensation for variations of a nominally static $B_o$ field in an imaged volume during an MRI sequence, said apparatus comprising:
   (a) means for generating and recording MRI image data which is phase-encoded by magnetic gradient pulses during a sequence of plural successive TR intervals to yield an image of nuclear magnetic resonant (NMR) nuclei populations within said image volume after multi-dimensional transformation;
   (b) means for, during each said TR interval, additionally generating and recording $B_o$ field calibration data by omitting at least one of said magnetic gradient pulses during recordation of NMR responses;
   (c) means for processing said calibration data to generate phase/frequency correction data required to compensate MRI image data taken during each TR interval for $B_o$ magnetic field variations in the nominally static $B_o$ field;
   (d) means for phase/frequency shifting said MRI image data for each TR interval in accordance with said phase/frequency correction data; and
   (e) means for multi-dimensionally transforming the corrected MRI image data to produce an image having reduced artifacts caused by variations in the nominally static $B_o$ field during said MRI sequence.

12. Magnetic resonance imaging apparatus as in claim 11 wherein:
   (i) as a part of means (a), means are provided for selectively eliciting NMR responses during each TR interval from M plural successive slice volumes for a given $\phi$ phase encoding value of a first-dimension magnetic gradient pulse, a second-dimension phase encoding magnetic gradient pulse being present during said NMR responses; and
   (ii) as a part of means (b), means are provided for selectively eliciting a further NMR response during each TR interval from at least one further M+1 slice volume but without said magnetic gradient pulses being present during said further NMR response.

13. Magnetic resonance imaging apparatus as in claim 11 wherein:

(i) as part of means (a), means are provided for selectively eliciting NMR response during each TR interval from plural first slice volumes for a given $\phi$ phase encoding value of a first-dimension magnetic gradient pulse, a second-dimension phase encoding magnetic gradient pulse being present during said NMR responses; and (ii) as a part of means (b), means are provided for selectively eliciting further NMR responses during each TR interval from further plural second slice volumes but without said magnetic gradient pulses being present during said further NMR responses. said second slice volumes being interleaved with said first slice volumes.

14. Magnetic resonance imaging apparatus as in claim 11 wherein:

(i) as part of means (a), means are provided for selectively eliciting NMR responses during each TR interval from M plural successive slice volumes for a given $\phi$ phase encoding value of a first-dimension magnetic gradient pulse, a second-dimension phase encoding magnetic gradient pulse being present during said NMR responses;

(ii) as part of means (b), means are provided for selectively eliciting further NMR responses during each TR interval from at least one further M+1 slice volume but without said magnetic gradient pulses being present during said further NMR responses; and (iii) said eliciting of further NMR responses being repeatedly performed within each TR interval and interleaved with elicitation of NMR responses from said M plural successive slice volumes.

15. Magnetic resonance imaging apparatus as in claim 11 wherein:

(i) as a part of means (a), means are provided for selectively eliciting first NMR responses during each TR interval from M plural successive slice volumes for a given $\phi$ phase encoding value of a first-dimension magnetic gradient pulse, a second-dimension phase encoding magnetic gradient pulse being present during said NMR responses; and (ii) as a part of means (b), means are provided for selectively eliciting a further NMR response during each TR interval immediately after eliciting each first NMR response from the same slice volume but without said magnetic gradient pulses being present during said further NMR response and after removing residual phase encoding effects.

16. Magnetic resonance imaging apparatus as in claim 12, 13, 14 or 15 wherein the means for recording said further NMR responses records only a substantially truncated portion of said further NMR response as compared with the recorded NMR responses used for image reconstruction.

17. Magnetic resonance imaging apparatus as in claim 16 wherein the duration of truncated recorded NMR responses are truncated to less than 10% of the duration NMR responses recorded for imaging purposes.

18. Magnetic resonance imaging apparatus as in claim 11 wherein truncated recorded NMR responses truncated to a substantially decreased duration compared to NMR responses recorded for imaging purposes.

19. Magnetic resonance imaging apparatus as in claim 18 wherein the duration of truncated recorded NMR responses are truncated to less than 10% of the duration of NMR responses recorded for imaging purposes.

20. Magnetic resonance imaging apparatus as in claim 11 wherein means (a) includes means for eliciting NMR responses simultaneously from an entire imaged volume using a sequence having three dimensions of spatial-domain phase encoding obtained by varying magnetic gradient pulses.

21. A magnetic resonance imaging method as in claim 1 wherein step (b) is performed at times and volume locations as depicted in at least one of FIGS. 13A through 13G.

22. A magnetic resonance imaging method as in claim 21 wherein step (a) comprises acquisition of image data using at least one of the following types of NMR RF responses:
(a) spin-echo (SE),
(b) gradient reversal echo (GRE),
(c) free induction decay (FID).

23. A magnetic resonance imaging method as in claim 21 or 22 wherein step (b) comprises acquisition of calibration data using at least one of the following types of NMR RF responses:
(a) spin echo (SE),
(b) free induction decay (FID).

24. A magnetic resonance imaging method as in claim 1 wherein step (c) comprises processing of calibration data using at least one of the following types of processes:
(a) Fourier Transformation;
(b) determining slope of the phase of the NMR RF response;
(c) determining only the fundamental frequency of the NMR RF response.

25. Magnetic resonance imaging apparatus as in claim 11 wherein means (b) is active at times and volume locations as depicted in at least one of FIGS. 13A through 13G.

26. Magnetic resonance imaging apparatus as in claim 25 wherein means (a) comprises means for acquiring image data using at least one of the following types of NMR RF responses:
(a) spin-echo (SE),
(b) gradient reversal echo (GRE),
(c) free induction decay (FID).

27. Magnetic resonance imaging apparatus as in claim 25 or 26 wherein means (b) comprises means for acquiring calibration data using at least one of the following types of NMR RF responses:
(a) spin echo (SE),
(b) free induction decay (FID).

28. Magnetic resonance imaging apparatus as in claim 11 wherein means (c) comprises means for processing of calibration data using at least one of the following types of processes:
(a) Fourier Transformation;
(b) determining slope of the phase of the NMR RF response;
(c) determining only the fundamental frequency of the NMR RF response.

* * * * *